United States Patent
Hutchison et al.

(10) Patent No.: US 11,133,703 B2
(45) Date of Patent: *Sep. 28, 2021

(54) METHOD AND APPARATUS TO RETRIEVE DATA FROM POWER DISTRIBUTION UNITS

(71) Applicant: Vertiv Corporation, Columbus, OH (US)

(72) Inventors: Gordon Hutchison, Rugby (GB); Zachary Sadecki, Columbus, OH (US); Elemer Nyiry, Columbus, OH (US); Sam Riley, Over Stowey (GB)

(73) Assignee: Vertiv Corporation, Columbus, OH (US)

( * ) Notice: Subject to any disclaimer, the term of this patent is extended or adjusted under 35 U.S.C. 154(b) by 86 days.

This patent is subject to a terminal disclaimer.

(21) Appl. No.: 16/673,500

(22) Filed: Nov. 4, 2019

(65) Prior Publication Data

US 2020/0067345 A1 Feb. 27, 2020

Related U.S. Application Data

(63) Continuation-in-part of application No. 15/209,157, filed on Jul. 13, 2016, now Pat. No. 10,466,767.

(Continued)

(51) Int. Cl.
*G06F 11/30* (2006.01)
*G06F 11/10* (2006.01)
(Continued)

(52) U.S. Cl.
CPC .......... *H02J 13/00001* (2020.01); *G06F 3/14* (2013.01); *G06F 11/1004* (2013.01);
(Continued)

(58) Field of Classification Search
CPC ............... G06F 1/32; G06F 1/26; G06F 11/10
See application file for complete search history.

(56) References Cited

U.S. PATENT DOCUMENTS 5,235,565 A * 8/1993 Aschenbrouich .. G06Q 20/0652
235/378
5,752,216 A * 5/1998 Carlson ................ G08G 5/0082
701/120

(Continued)

FOREIGN PATENT DOCUMENTS

| CN | 1722105 A | 1/2006 |
|---|---|---|
| CN | 100393107 C | 6/2008 |
| CN | 102110927 A | 6/2011 |

OTHER PUBLICATIONS

PCT International Search Report for International Application No. PCT/US16/42071 dated Sep. 26, 2016.

(Continued)

*Primary Examiner* — Phil K Nguyen
(74) *Attorney, Agent, or Firm* — Suiter Swantz pc llo

(57) ABSTRACT

The present disclosure is a method and apparatus to retrieve data from a power distribution unit. Apparatus to retrieve data from a power distribution unit may include a processor, memory and display which may be coupled to tracking circuitry of the power distribution unit in order to allow viewing of current operating conditions of the power distribution unit. In an embodiment of the disclosure, the processor may be configured to convert data from the tracking circuitry of the power distribution unit into a stream of character sets presented on the display which may be interpreted by a mobile device and translated by the mobile device into human readable information.

12 Claims, 9 Drawing Sheets

Related U.S. Application Data

(60) Provisional application No. 62/191,596, filed on Jul. 13, 2015.

(51) Int. Cl.
    *H02J 13/00*     (2006.01)
    *G06F 11/34*     (2006.01)
    *H04N 5/232*     (2006.01)
    *G06F 3/14*     (2006.01)
    *H05K 7/14*     (2006.01)
    *G06F 3/0481*     (2013.01)

(52) U.S. Cl.
    CPC ...... *G06F 11/3058* (2013.01); *G06F 11/3495* (2013.01); *H04N 5/23222* (2013.01); *H04N 5/232945* (2018.08); *H05K 7/1492* (2013.01); *G06F 3/04817* (2013.01)

(56) References Cited

U.S. PATENT DOCUMENTS

| | | | |
|---|---|---|---|
| 7,522,075 | B2 | 4/2009 | Mak |
| 7,596,719 | B2 * | 9/2009 | Pedersen ............ G06F 11/2236 714/31 |
| 7,964,989 | B1 | 6/2011 | Puschnigg et al. |
| 8,654,176 | B2 * | 2/2014 | Takahashi ............ H04N 21/854 348/14.04 |
| 9,013,283 | B1 | 4/2015 | Tackaberry |
| 2002/0002593 | A1 | 1/2002 | Ewing |
| 2002/0075326 | A1 | 6/2002 | Allen |
| 2004/0090219 | A1 | 5/2004 | Chapuis |
| 2005/0184886 | A1 | 8/2005 | Fauque |
| 2006/0083404 | A1 | 4/2006 | Shimosato |
| 2006/0217905 | A1 | 9/2006 | Pai et al. |
| 2007/0181691 | A1 | 8/2007 | Chang |
| 2008/0073208 | A1 | 3/2008 | Wang et al. |
| 2009/0236909 | A1 | 9/2009 | Aldag et al. |
| 2009/0262138 | A1 | 10/2009 | Bradbury et al. |
| 2011/0062780 | A1 | 3/2011 | Verges et al. |
| 2011/0101777 | A1 | 5/2011 | Jansma |
| 2011/0160588 | A1 | 6/2011 | Ichikawa |
| 2011/0234635 | A1 | 9/2011 | Utsuki |
| 2012/0092060 | A1 | 4/2012 | Ganesan |
| 2012/0229515 | A1 | 9/2012 | Cao |
| 2013/0049466 | A1 | 2/2013 | Adams |
| 2013/0338844 | A1 | 12/2013 | Chan et al. |
| 2014/0188673 | A1 | 7/2014 | Graham et al. |
| 2015/0002870 | A1 | 1/2015 | Burke, Jr. et al. |
| 2016/0233707 | A1 | 8/2016 | Kidakarn |

OTHER PUBLICATIONS

Office Action dated Jan. 16, 2019 for EP Patent Application No. 16825101.5.
Office Action dated Jun. 1, 2020 for Chinese Application No. 201680041252.6.

\* cited by examiner

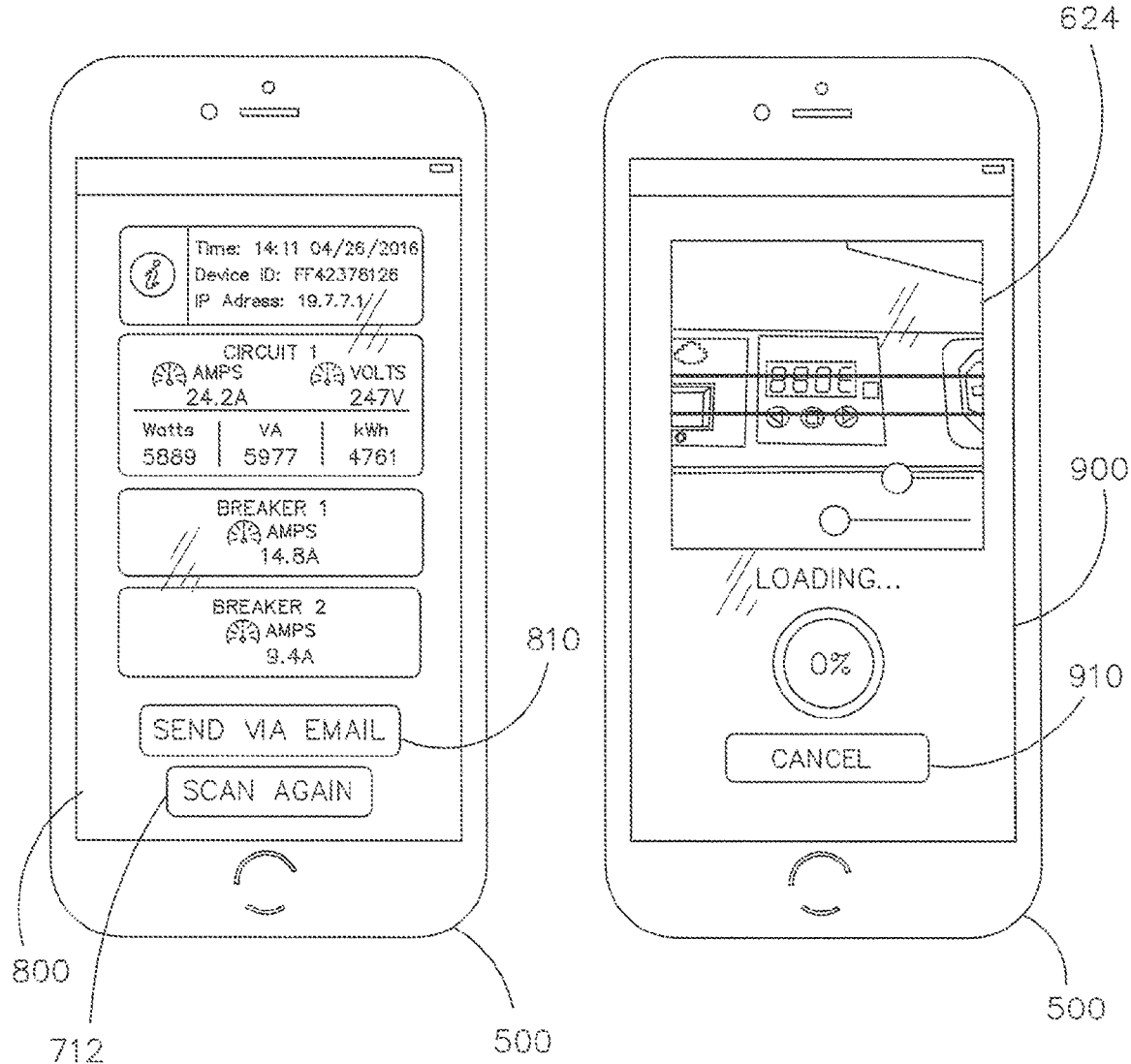

METHOD AND APPARATUS TO RETRIEVE DATA FROM POWER DISTRIBUTION UNITS

CROSS REFERENCE TO RELATED APPLICATIONS

This present application claims the benefit under 35 U.S.C. § 120 of U.S. patent application Ser. No. 15/209,157 filed Jul. 13, 2016. The U.S. patent application Ser. No. 15/209,157 filed Jul. 13, 2016 claims the benefit under 35 U.S.C. § 119 of U.S. Provisional Patent Application Ser. No. 62/191,596 filed Jul. 13, 2015. The U.S. patent application Ser. No. 15/209,157 filed Jul. 13, 2016 and the U.S. Provisional Application Ser. No. 62/191,596 filed Jul. 13, 2015 are incorporated by reference in their entirety.

TECHNICAL FIELD

The present disclosure generally relates to the field of distributing electrical power and maintaining the thermal environment in data processing equipment, and more particularly to, a method and apparatus to retrieve data from power distribution units.

BACKGROUND

Many electronic devices, particularly computer and data storage equipment, are supplied power from an alternating current (AC) or direct current (DC) electrical power source. For computer and data storage equipment, various power systems and thermal cooling systems are typically employed. A typical system may include a display to provide information on current operating conditions. However, often the display is too small to quickly retrieve and analyze the data associated with the operating conditions of a unit. Further, often it is not possible for a user to retrieve data from the power and thermal systems due to unsafe handling conditions (e.g., temperature conditions, lighting conditions, space constraints, and the like) of the power and thermal systems.

SUMMARY

Accordingly, the present disclosure is directed to a method and apparatus to retrieve data from a power distribution unit. The apparatus to retrieve data from a power distribution unit may include a processor, memory, and display which may be coupled to tracking circuitry within the power distribution unit in order to allow viewing of current operating conditions of the power distribution unit. In an embodiment of the disclosure, the processor may be configured to convert data from the tracking circuitry of the power distribution unit into a stream of character sets presented on the display which may be interpreted by a mobile device and translated by the mobile device into human readable information.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which:

FIG. 8 depicts a screenshot of an application of exemplary operating information of a power distribution unit in accordance with an alternative embodiment of the present disclosure;

FIG. 9 depicts a screenshot of an application including a guide for reading data from a monitoring device and a loading indicator in accordance with an embodiment of the present disclosure;

DETAILED DESCRIPTION

Reference will now be made in detail to the subject matter disclosed, which is illustrated in the accompanying drawings.

Before any embodiments of the disclosure are explained in detail, it is to be understood that the embodiments may not be limited in application per the details of the structure or the function as set forth in the following descriptions or illustrated in the figures. Different embodiments may be capable of being practiced or carried out in various ways. Also, it is to be understood that the phraseology and terminology used herein is for the purpose of description and should not be regarded as limiting. The use of terms such as "including," "comprising," or "having" and variations thereof herein are generally meant to encompass the item listed thereafter and equivalents thereof as well as additional items. Further, unless otherwise noted, technical terms may be used according to conventional usage. It is further contemplated that like reference numbers may describe similar components and the equivalents thereof.

Figure 1:
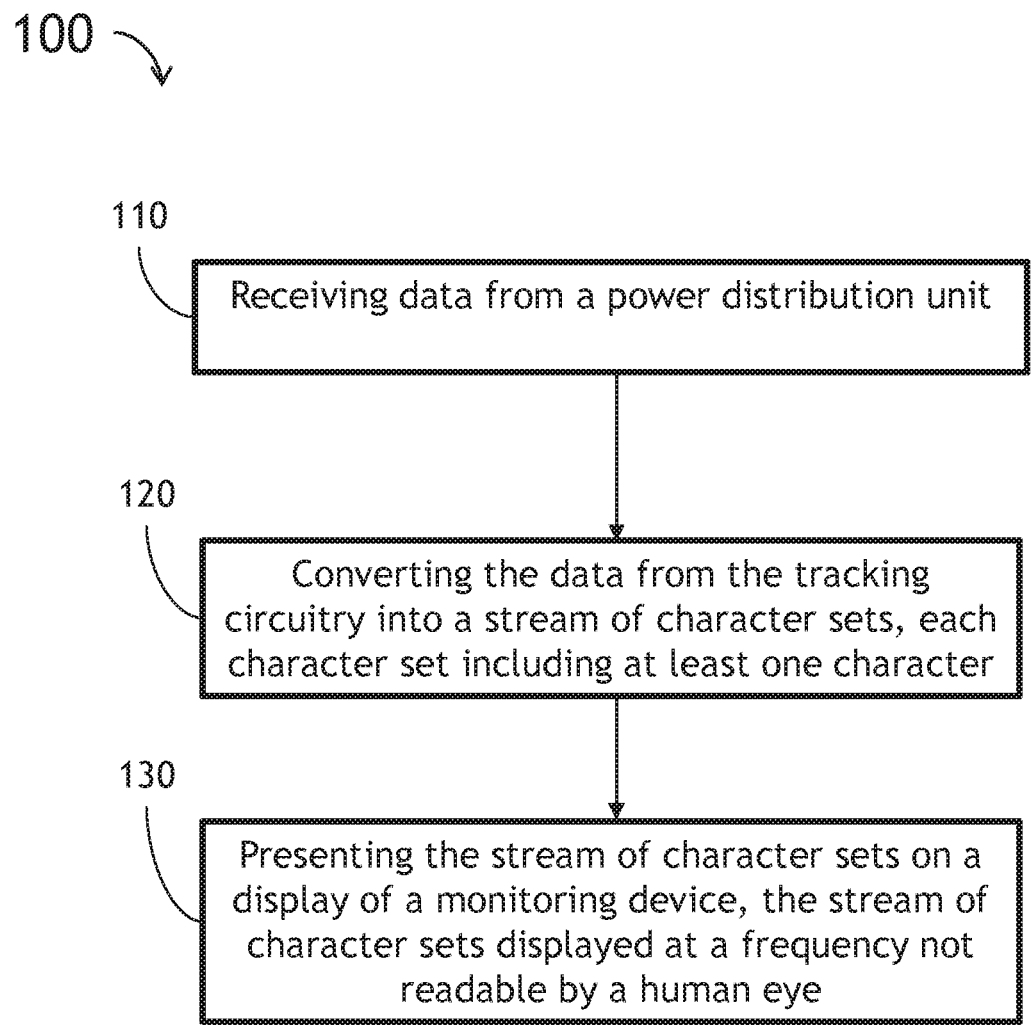
FIG. 1 depicts a flow diagram of a method for retrieving data from a power distribution unit in accordance with an embodiment of the present disclosure.

Referring to FIG. 1, a flow diagram of a method 100 for retrieving data from a power distribution unit in accordance with an embodiment of the present disclosure is shown. Method 100 may be executable by a monitoring device coupled to tracking circuitry of a power distribution unit for retrieving data from the power distribution unit. Method 100 may include receiving data from the tracking circuitry of the power distribution unit, the data including operating information of the power distribution unit 110. Method 100 may include converting the data from the tracking circuitry into a stream of character sets 120. It is contemplated that each character set may include at least one character per character set. Method 100 may further include presenting the stream of character sets via a display of a monitoring device 130. It is contemplated that the stream of character sets is presented on the display as individual character sets at a frequency not readable to a human eye. For example, the character sets may be individually flashed at a frequency in which an individual character set is not readable to a human eye. For example, the stream of character sets may be flashed at a frequency of at least 1 Hertz.

Further it is contemplated that the stream of character sets may be flashed at a frequency that adapts to the environment of the power distribution unit.

Figure 2:
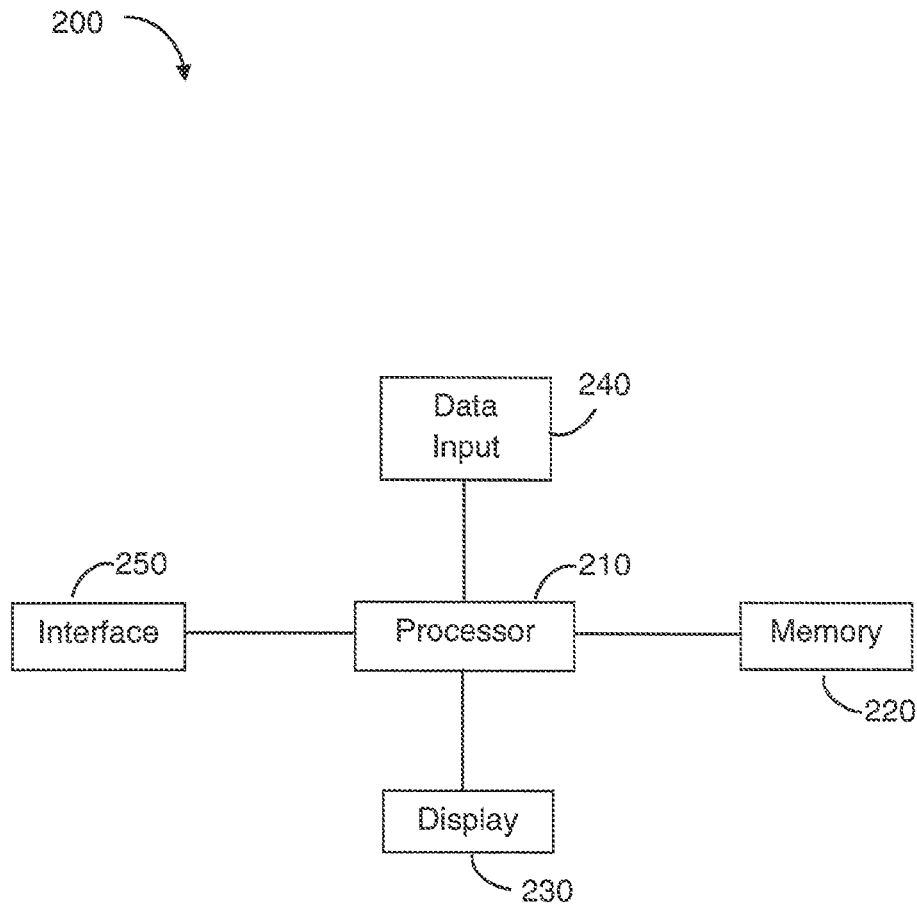
FIG. 2 depicts a block diagram of an apparatus to retrieve data from a power distribution unit in accordance with an embodiment of the present disclosure.

Referring to FIG. 2, a block diagram of an apparatus 200 to retrieve data from a power distribution unit in accordance with an embodiment of the present disclosure is shown. It is contemplated that apparatus 200 to retrieve data from a power distribution unit may be a monitoring device configured to execute method 100 for retrieving data from a power distribution unit as depicted in FIG. 1. It is further contemplated that apparatus 200 and monitoring device may be used interchangeably, unless otherwise noted herein.

Apparatus 200 may include a processor 210. Apparatus 200 may further include a memory 220 and display 230. It is contemplated that processor 210 may be configured to run various software applications or computer codes stored in a non-transitory computer-readable medium, such as memory 220, and configured to execute various instructions or operations. Apparatus 200 may further include a data input device 240. Data input device 240 may be configured to couple with tracking circuitry of a power distribution unit whereby data including operating information of the power distribution unit may be received and processed by processor 210. It is contemplated that data input device may be removably connected with the tracking circuitry. For example, it is contemplated that data input may include a connector to allow removable connection with a cable or set of leads coupled with tracking circuitry of a power distribution unit. Apparatus 200 may further include an interface 250. Interface 250 may include one or more ports for coupling with other devices and may further include one or more buttons to control operation of apparatus 200. Buttons may include a hard reset, an adjustment of dynamic or static display, adjustment of an orientation of display, and the like. It should be understood that display 230 may include a touch screen which may further allow user to interface with apparatus 200. Additionally, it is contemplated that apparatus 200 may further include a housing which may be configured to be contained within a power distribution unit.

It is contemplated that display 230 may be a light emitting diode (LED) display or a single LED indicator, or the display may be an illumination LED. LED displays may be arranged in a singular or plural configuration. Any color may be utilized. LED displays may include common 7-segment, 14-segment and dot-matrix LED display modules, or single or illumination LEDs.

However, it is contemplated that various types of displays may be operable. For example, essentially any visual interface may be manipulated to transmit data at a frequency that is not readable to a human eye. There may be 1 to n number of displays to present simply binary data. For example, 7 LEDs arranged in a row may provide 128 unique combinations. Liquid crystal display (LCD) technology may rapidly display compact QR codes for example, as well as displaying static information. Liquid crystal displays may be arranged as an alphanumeric, graphical or dot matrix style. LCDs may be available as transmissive (with backlight), reflective (no backlight, relying on ambient light for readability) and transreflective (a combination of transmissive and reflective technologies). Electroluminescent displays may be employed. Electroluminescent displays may be compact and may include unusual geometries that may be obtained. Typically, electroluminescent displays may be used as LCD backlights, but wafer-thin electroluminescent display panels may be cut into unusual shapes to create an impressive custom display. Vacuum fluorescent displays may be employed. Vacuum fluorescent displays may emit a bright light with high contrast, in one or more colors. Vacuum fluorescent displays may be manufactured to display seven-segment numerals, multi-segment alpha-numeric characters or may be made in a dot-matrix to display different alphanumeric characters and symbols. There is little limit to the shape of the image that may be displayed for vacuum fluorescent displays; it may depend solely on the shape of phosphor on the anodes.

Figure 3A:
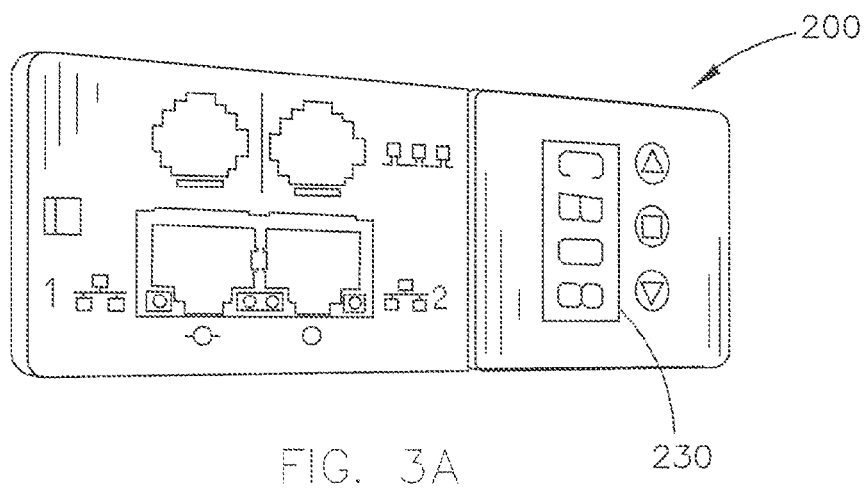
FIGS. 3A, 3B and 3C depict an apparatus to retrieve data from a power distribution unit in accordance with embodiments of the present disclosure.
Figure 3B:
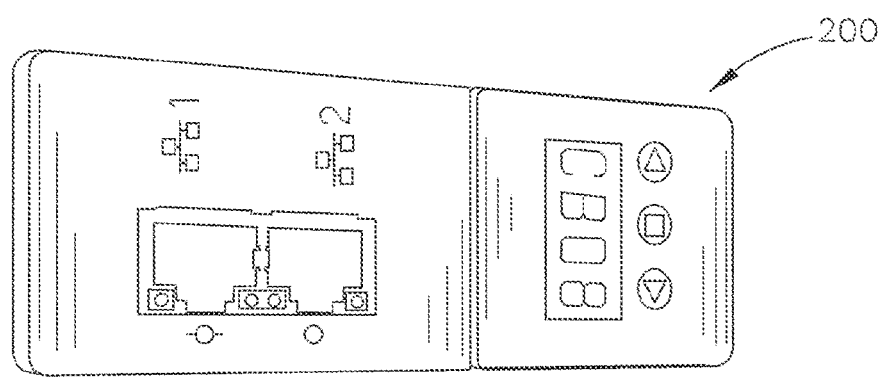
Figure 3C:
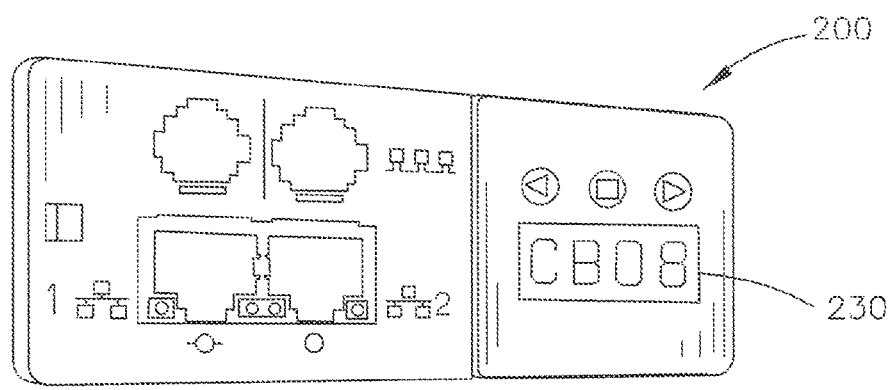

Referring to FIGS. 3A, 3B and 3C, an apparatus 200 to retrieve data from a power distribution unit in accordance with embodiments of the present disclosure are shown. It is contemplated that interface 250 may include buttons to control operation of apparatus 200 and may include various ports to allow communication with other devices. It is further contemplated that apparatus 200 may include a display 230. Display 230 may be oriented in a generally horizontal direction or generally vertical direction in order to suit the needs of various users.

Figures 4A, 4B:
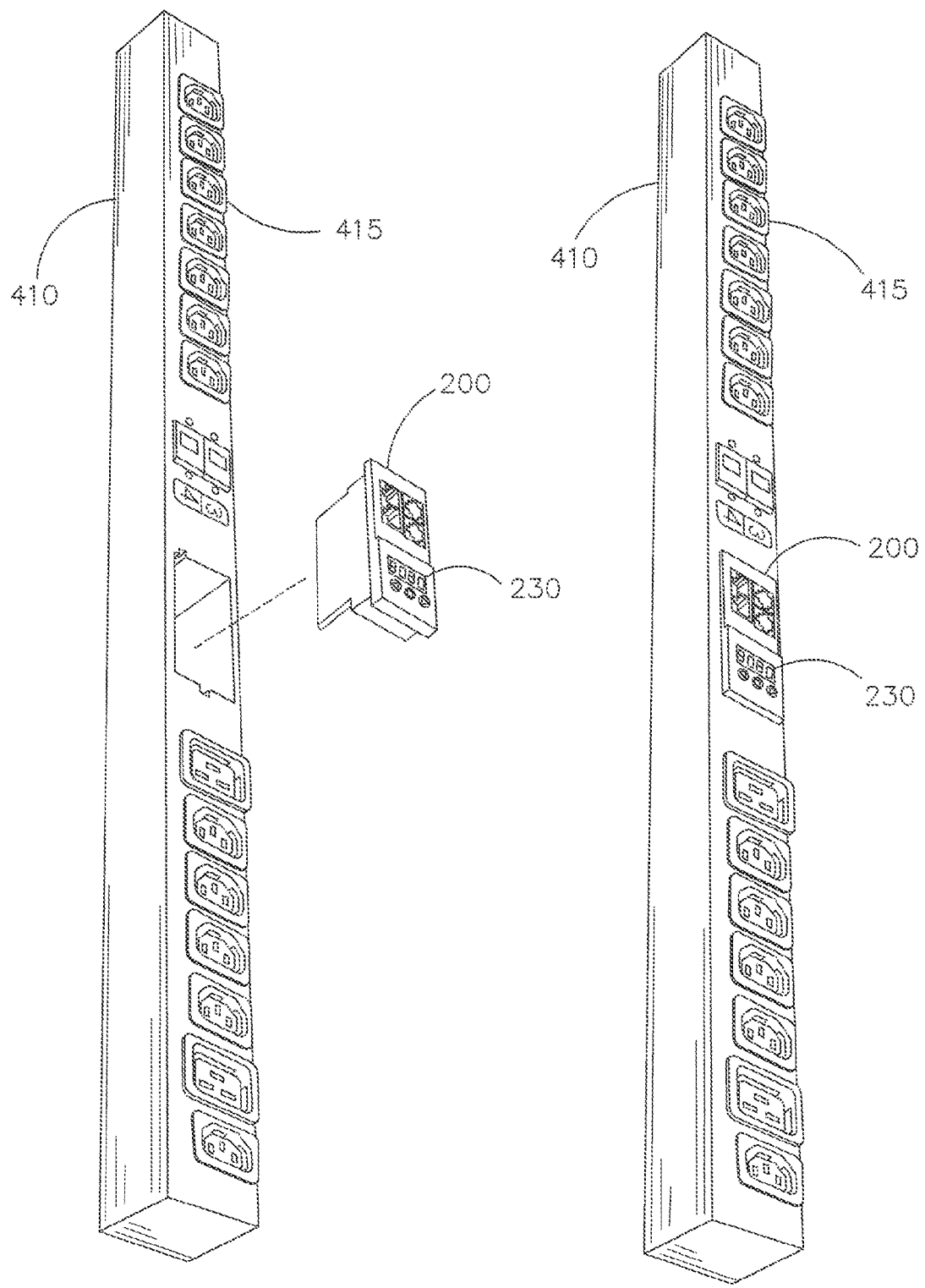
FIGS. 4A and 4B depict an apparatus to retrieve data from a power distribution unit contained within an exemplary power distribution unit in accordance with an embodiment of the present disclosure.

Referring to FIGS. 4A and 4B, an apparatus 200 to retrieve data from a power distribution unit contained within an exemplary power distribution unit (PDU) 410 in accordance with an embodiment of the present disclosure is shown. Apparatus 200 may include a display 230 and may include a housing which may be removably installed and replaced within a power distribution unit 410. It is contemplated that power distribution unit 410 may include a long, thin housing which may contain at least one receptacle 415, or outlet plug, to distribute power to devices coupled to the receptacle or outlet plug. Power distribution unit 410 may include an input power cable (not shown). Internal to the power distribution unit, a plurality of relays and/or circuit breakers may be included which may isolate other circuits or receptacles. Power distribution unit 410 may further include tracking circuitry which may track operating conditions of the power distribution unit 410, such as serial number, circuit configuration, outlet count, voltage, current and power available at the various circuits of the power distribution unit 410. For example, tracking circuitry may include one or more sensors and meters to track Amperes, Volts, watts, VA, kWhr and may further track environmental data such as temperature, humidity, and contact status. Tracking circuity may include one or more cables, coupled to one or more sensors or meters to transfer operating information data to data input device 240 of apparatus 200.

Figure 5:
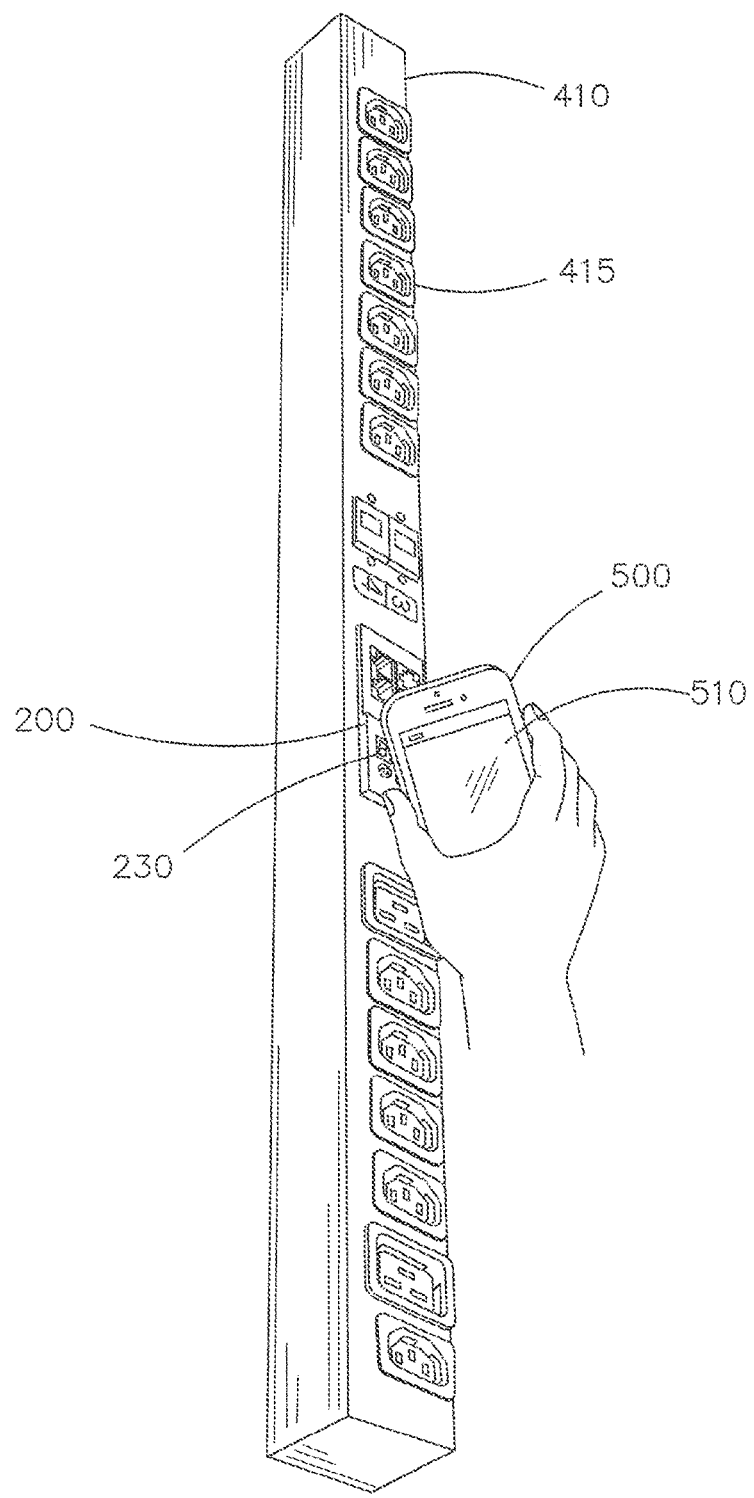
FIG. 5 depicts an exemplary mobile device in proximity with an apparatus to retrieve data from a power distribution unit in accordance with an embodiment of the present disclosure.

Referring to FIG. 5, an exemplary mobile device 500 in proximity with an apparatus 200 to retrieve data from a power distribution unit in accordance with an embodiment of the present disclosure is shown. As previously described, display 230 of apparatus 200 may be configured to present a stream of character sets. The stream of character sets may be presented on the display 230 as individual character sets at a frequency not readable to a human eye. For example, the character sets may be individually flashed at a frequency in which an individual character set is not readable to a human eye. For example the stream of character sets may be flashed at a frequency of at least 1 Hertz. Advantageously, significantly more information may be presented from the limited space of a display 230 to be acquired from the power distribution unit in a quicker period of time than what can be provided by a conventional display.

Ambient light levels vary greatly between power distribution units requiring a variable frequency range of the stream of character sets presented on the display 230 to accommodate the technological capabilities of mobile devices anticipated in the future. It is contemplated that the frequency in which the stream of character sets are presented on the display may vary depending on the ambient light levels of the power distribution units. For example, the frequency in which the stream of characters are presented on the display may be slowed down when the ambient light levels of the power distribution units are high. By way of another example, the frequency in which the stream of characters are presented on the display may be slowed down when the ambient light levels of the power distribution units cause reflections on the display 230 and impede the mobile device from reading the stream of characters presented on the display.

Further, it is contemplated that a higher frequency range may be possible with advances in mobile technology and display technology. For example, during testing, presenting the stream of character sets on the display at a frequency of 30 Hertz (in a controlled environment) allowed an iPhone 7 to accurately capture the stream of character sets. By way of another example, presenting the stream of character sets on the display at a frequency of 22 Hertz (in a controlled environment) allowed an Android 7 to accurately capture the stream of character sets. Applicant notes that current modern mobile devices may be configured to capture images up to 1000 fps (e.g., 500 Hertz) when utilizing slow motion features. It is further contemplated that advances in display and camera technology will continue to increase the frequency range that may be employed.

As shown in FIG. 5, it is contemplated that a mobile device 500 utilizing an integrated camera device operating an application may be configured to read the character sets which may be individually flashed at a frequency in which an individual character set is not readable to a human eye. Mobile device 500 may employ a camera feature through the application and may scan the output of the display 230 and convert the character sets into human readable information presented on a display 510 of the mobile device 500. It is contemplated that the application to interpret the character sets from display may be a mobile device application, often referred as an app, executed by a processor of one or more mobile computing devices (e.g., iPhones and Android devices, tablets and the like).

Figure 6A:
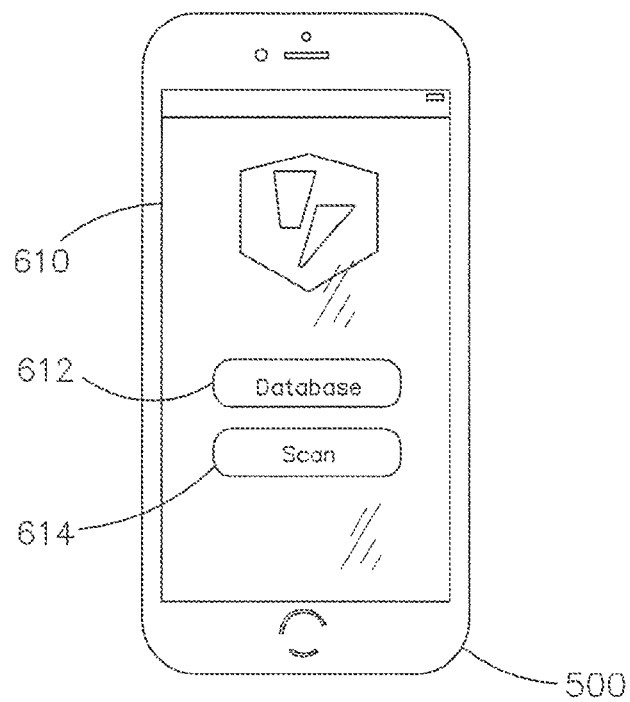
FIGS. 6A, 6B and 6C depict an exemplary screenshot of an application configured to be executed with a camera device of a mobile device for interpreting the individual character sets on the display of the monitoring device at a frequency not readable to a human eye.
Figure 6B:
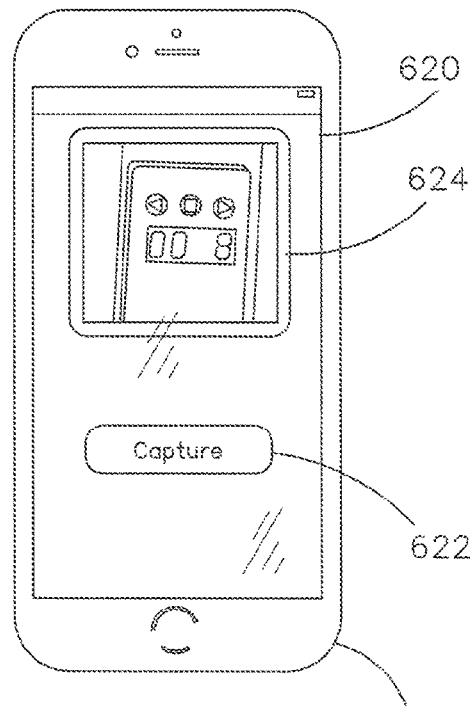
Figure 6C:
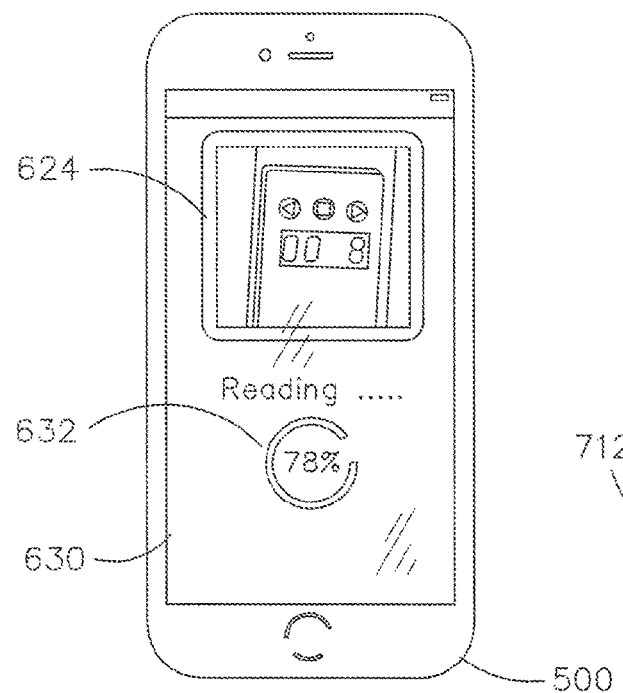

Referring to FIGS. 6A, 6B and 6C, exemplary screenshots of an application configured to be executed with a camera device of a mobile device for interpreting the individual character sets on the display of the monitoring device at a frequency not readable to a human eye are shown. Referring specifically to FIG. 6A, screenshot 610 may include an icon to access a database 612 and an icon to begin a scan 614. It is contemplated that application may include a database, local and/or cloud-server based, which may include information about prior readings of power distribution units which can be used to compare with a current reading. The collection of operating information including identification information into a local database may provide for simple cabinet to cabinet local data logging. Additionally, operating information may be downloaded through an email or other transfer process for manipulation by external source (e.g., Excel).

Upon initiation of the scan 614 of the screenshot 610 of FIG. 6A, a screenshot 620 may be initiated as shown in FIG. 6B. Screenshot 620 may include a capture icon 622 to begin capture of the character sets being presented on a display 230 of apparatus 200. Screenshot 620 may further include a camera display portion 624 which shows the image of what is currently being captured by a camera device of the mobile device 500. It is contemplated that a user may hold the mobile device 500 whereby the display 230 of apparatus 200 may be visible in the camera display portion 624. After a user activates the capture icon 622, the mobile device may begin reading the character sets of display 230 of apparatus 200. Upon activation of the capture icon 622, it is contemplated that screenshot 630 of FIG. 6C may be initiated. Screenshot 630 may include camera display portion 624 and may also include a reading completion icon 632 which may indicate a percentage of completion of the reading.

Figure 7:
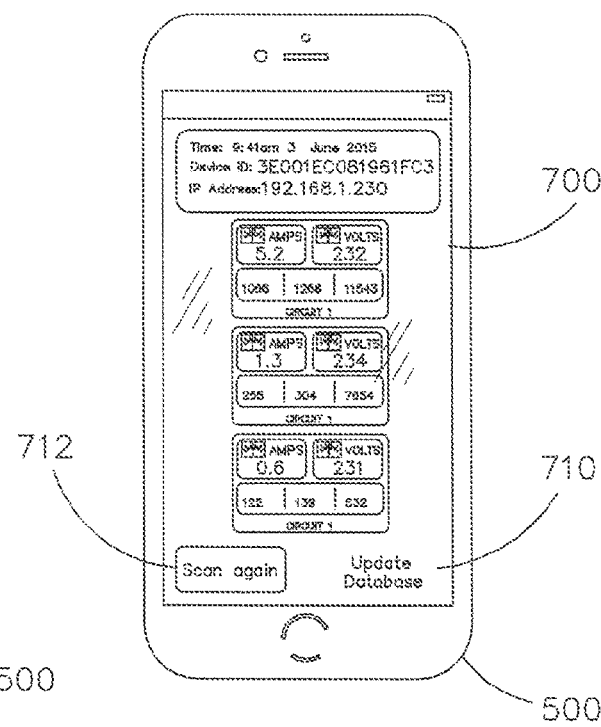
FIG. 7 depicts a screenshot of an application that includes exemplary operating information of a power distribution unit in accordance with an embodiment of the present disclosure.

Referring to FIG. 7, a screenshot 700 of an application that includes exemplary operating information of a power distribution unit in accordance with an embodiment of the present disclosure is shown. It is contemplated that the application executed by the processor of mobile device 500 may interpret the character sets and may produce the operating information of a power distribution unit. The operating information may include a time stamp, device identification, an IP address, along with voltage and current information. Screenshot 700 may include an update database icon 710 and a scan again icon 712. The update database icon 710 may initiate archival storage of the operating information within a database. The scan again icon 712 may initiate another scan and may initiate screenshot 620 of FIG. 6B to repeat the process to complete a scan. It is contemplated that screenshot 700 may only be initiated if the data capture has been validated by an integrated error-checking algorithm. For example, the integrated error-checking algorithm may ensure that the application may only display data it has validated as correct and therefore prevent error and omissions from being stored in the database.

Referring to FIG. 8, a screenshot 800 of an application of exemplary operating information of a power distribution unit in accordance with an alternative embodiment of the present disclosure is shown. It is contemplated that the application executed by the processor of mobile device 500 may interpret the character sets and may produce the operating information of a power distribution unit. The operating information may include a time stamp, device identification, an IP address, along with voltage, current, and thermal information. It is further contemplated that power consumption, electrical power consumption, and specific breaker information may be presented. Screenshot 800 may include a scan again icon 712. Screenshot 800 may further include a send via email icon 810 which may initiate an email message to be sent to a desired address which includes the operating information that has just been read.

Referring to FIG. 9, a screenshot 900 of an application including a guide for reading data from the monitoring device and a loading indicator in accordance with an embodiment of the present disclosure is shown. Screenshot 900 may include a camera display portion 624 which shows the image of what is currently being captured by a camera device of the mobile device 500. Screenshot 900 may further include a cancel icon 910 which may terminate a scan. As shown in FIG. 9, it is contemplated that camera display portion 624 may include a guide to aid the user in reading the character sets of a display 230 of apparatus 200. In one embodiment, guide may refer to two lines whereby the character sets should be placed within the two lines. Other types of guides may include a transparent but highlighted area to allow a user to more easily capture the character sets of a display 230 of apparatus 200. It is further contemplated that camera display portion 624 may include on display control icons including an exposure adjustment and a zoom adjustment to more quickly enhance data capture of a display 230 for a user. It is also contemplated that the sliding dial may be employed which depicts a percentage (0%-100%) of data successfully captured. This scale can decrease as well as increase if the capture accuracy is poor to enable a user to adjust orientation of the mobile device 500, the exposure adjustment or zoom adjustment to increase scanning speed and accuracy.

Figure 10:
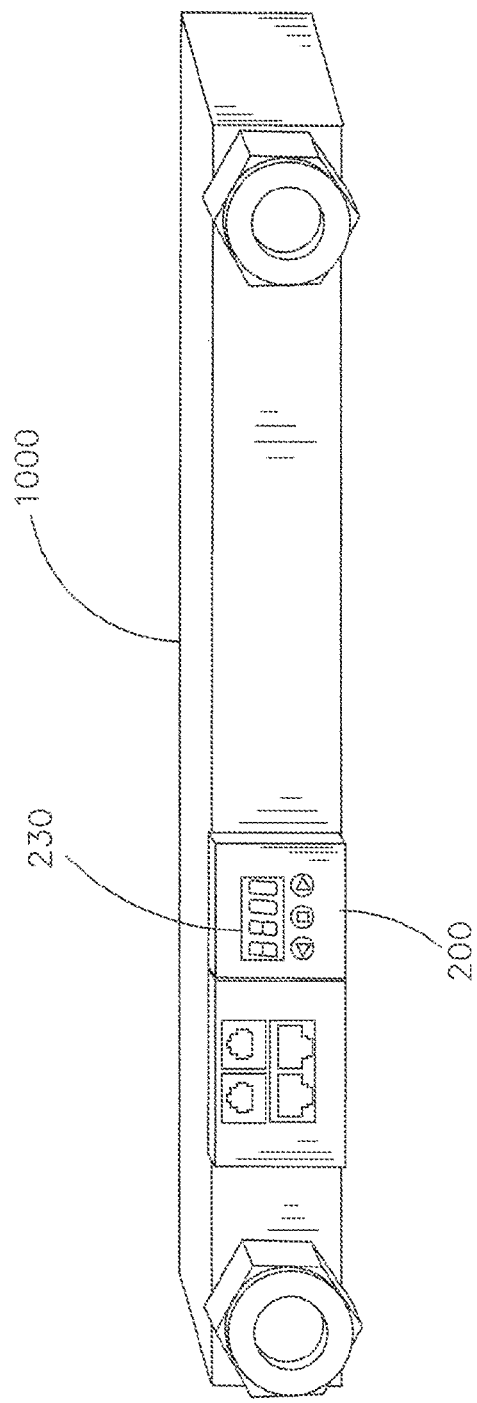
FIG. 10 depicts an auxiliary device for containing an apparatus to retrieve data from a power distribution unit in accordance with an embodiment of the present disclosure.

Referring to FIG. 10, an auxiliary device 1000 for containing an apparatus 200 to retrieve data from a power distribution unit in accordance with an embodiment of the present disclosure is shown. Auxiliary device 1000 may be easily installed within a computer or server rack and may allow apparatus 200 to be coupled with a power distribution unit. It is contemplated that auxiliary device 1000 may be employed when a user desires use of apparatus 200 but the power distribution unit may not contain space for housing apparatus 200.

While it is contemplated that display 230 of apparatus 200 may be configured to present each character set including at least one character, the stream of character sets presented on the display 230 as individual character sets at a frequency may not be readable to a human eye. However, it is contemplated that display 230 may further be configured to present data that is visible to the human eye. Display 230 may further be configured to present individual character sets at a frequency may not be readable to a human eye. Additionally, display 230 may present characters in two independent but concurrent streams, such as a master and sub stream. The master stream refresh and persistence rates are such that they can be seen by the human eye, the sub stream refresh and persistence rates may be presentation of individual character sets at a frequency may not be readable to a human eye.

It is contemplated that a character of a character set may include a symbol, a letter, a numeral or a hexadecimal digit (include display illumination). An example of a possible codec is to display a hexadecimal digit (0-9, A-F) such that each character pair would represent one byte of data. In one embodiment, character set may include four hexadecimal digits whereby each individual character set may provide two bytes of data. Therefore, it is contemplated that an 80 byte data stream, in the four hexadecimal digit example, may use 40 individual character sets. A current advantage of using hexadecimal digits is that current mobile device operating systems such as Google Android and Apple iOS have text recognition built into the base operating system so additional sophisticated computer vision programing or third party software would not be necessary to interpret the display into a data stream. However, other codecs may be possible using 7 segments of each light emitting diode (LED) which may provide higher data compression, although these may employ a more bespoke decoding approach to process the camera image.

The frequency of the character sets may only be limited by the capabilities of the image capturing hardware of mobile device 500. It is contemplated that most standard mobile device hardware available at this time may be able to capture character sets at a frequency of at least 1 Hertz, in which a full data capture of 40-character sets may be achieved in less than 3 seconds. It is contemplated that many current mobile devices may be able to achieve much higher frequencies with 40-character sets being able to be captured in less than 1 second. As the performance of mobile device cameras increases, the capture time may be reduced.

It is contemplated that an exemplary data set may include 80 bytes. In an embodiment of the disclosure, the breakdown of the data set and the exemplary operating information may include:

Frame Sync
Frame Definition (may provide a number of character sets in the data set)
Device Identification (may provide serial number and outlet count)
IP Address
Input Circuit (up to 3):
  Voltage
  Amps
  Watts
  Volt-Amperes
  Energy: 5 bytes (integer kWHr)
  Cyclic Redundancy Check data
Cooling Circuit (up to 5):
  Capacity
  Thermal Setpoints
  Operational Mode It is contemplated that under the exemplary data distribution, the total data set may include 80 bytes of data if all 3 circuits are transmitted with differing payloads depending on the type of power distribution employed. If there is 1 byte per character, 4 simultaneously displayed characters may employ 20-character sets. Nyquist sampling theory may require data capture at 2 times a display cycle speed. For example, a 15 Hertz frequency may require a 30-fps camera device which is present in most current mobile devices, resulting in a total capture time of less than two seconds.

In addition to device identification, it is contemplated that meta-tags related to a power distribution unit may be enabled to be associated with different events, activities or operations such as: function, location, application, electrical supply and customer. Each power distribution unit may have multiple meta-tags assigned to it and as such they may be associated with multiple scanning and scheduled updates. It is further contemplated that a secure scan mode may be enabled whereby managers may configure particular power distribution units that may be scanned by designated personnel only.

It is contemplated that the application executed on the mobile device 500 may operate with a database, which may be an in-app database. Each power distribution unit may be identified via the asset tag number, or serial number and new data points may be logged and stored or new devices may be added. It is contemplated that user-defined fields may be available. The application configuration may freely move through both iOS and Android devices by means of an import/export database. This allows one user to setup a desired database and then clone it to any number of supported mobile devices. Additionally, the app may be configured to graph and export via comma-separated values (CSV) through electronic mail messages or to a cloud-based server.

Exemplary data collection for a power distribution unit may include:
1. Aggregation based on user fields (e.g., total kWh per row)
2. Set thresholds per identification device
3. Set global thresholds
4. Local alarms
5. Remote alarming (SMS/email)
6. Reminders
7. Work flow
8. Device positioning through GPS and other real time location service technologies (RTLS)

While the foregoing description and figures have described a method and apparatus of visible light communication from apparatus 200 to a mobile device 500, it is contemplated that apparatus 200 may also be configured to receive visible light communication. It is contemplated that full duplex communication may be implemented with mobile device 500 while maintaining a zero-contact approach. Apparatus 200 may include a light sensitive element, a light sensor, whereby the mobile device 500 may be configured to send data via visible light communication to apparatus 200. It is contemplated that mobile device 500 may be configured for visible light communication through its display, through a peripheral component coupled to the mobile device 500, or through an integrated flash of the mobile device 500.

Figure 11:
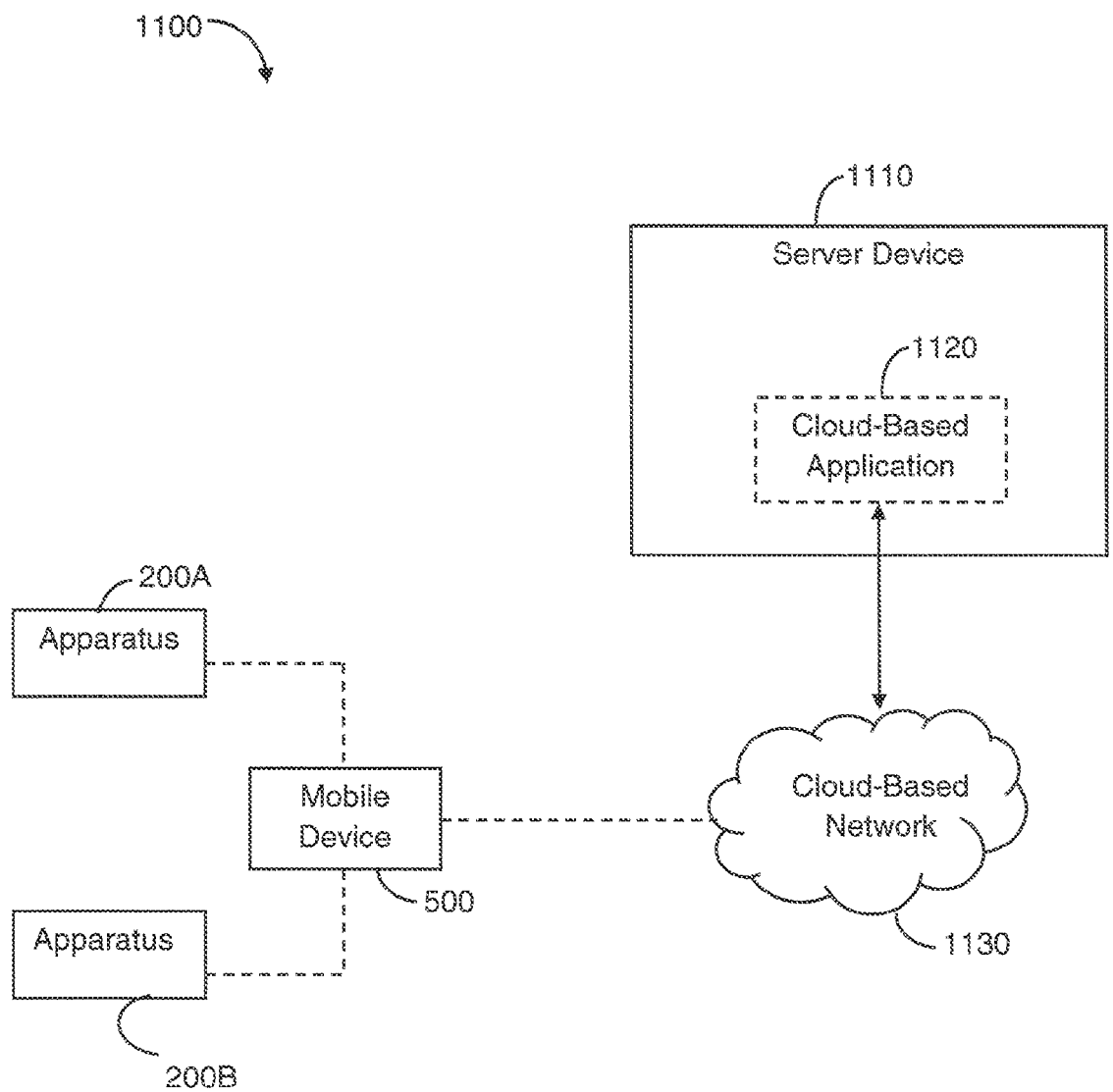
FIG. 11 depicts a system for managing a plurality of apparatuses that retrieve data from power distribution units in accordance with an embodiment of the present disclosure.

Referring to FIG. 11, a system 1100 for managing a plurality of apparatuses 200A, 200B that retrieve data from a power distribution unit in accordance with an embodiment of the present disclosure is shown. Apparatuses 200A, 200B may be referred as monitoring devices and may refer to a plurality of devices as previously described as apparatus 200. System 1100 may include a server device 1110 which may include a cloud-based application 1120. The cloud-based application 1120 implemented on the cloud-based server device 1110 may provide various interfaces facilitating the managing of a plurality of apparatuses 200A, 200B and their respective power distribution units. Additionally, cloud-based application 1120 implemented on cloud-based server device 1110 may provide an interface for cloud-based data storage via a database that may maintain operating information for each of a plurality of systems as previously described which comprise the infrastructure equipment ecosystem for power and thermal systems.

Server device 1110 may be configured to communicate with mobile device 500 via a cloud-based network 1130 (e.g., the internet) using the built-in wireless capabilities of the mobile device 500. Once a secure connection has been established and verified between the server device 1110 and mobile device 500, the operating information for various purpose specific power distribution units via apparatuses 200A, 200B may be transferred to a cloud-based database residing on a cloud-based server device 1110 (e.g., a web server accessible over a web-browser or application implemented on the mobile device 500). The cloud-based server device 1110 may implement at least one cloud-based application 1120 accessible by a mobile device 500 and/or one or more additional network devices such as a laptop or desktop computer.

In an example embodiment, through the web-browser software, a user can use a computer to log on to cloud-based services (e.g., by the web-browser software resident on the computer communicating with cloud-based server device 1110) to access a cloud-based application 1120. After logging-on to the cloud-based application 1120, the user may create, edit, save and delete files on cloud-based server device 1110, and may establish (set up) or change/edit various options, such as user preferences and/or system settings, and/or may receive or download software (e.g., operating system or other software) or software updates, various data files or media files, user preferences and/or system settings, and other information previously stored on the cloud-based server device 1110, via the cloud-based application 1120 running on the cloud-based server device 1110.

It is contemplated that server device 1110 operating cloud-based application 1120 may monitor a location of mobile device 500 to improve work flow management. Personnel may be directed and prioritized based upon system requirements and current locations of individuals. Mobile device 500 may implement Real Time Location Services (RTLS) to simultaneously associate coordinates of the mobile device 500 with receipt of operating information from apparatuses 200A, 200B. RTLS may be implemented through the use of any available "standards-based" location services platform including, but not limited to: GPS, Wireless LAN, Cellular Services, Radio Frequency Identification, and Infrared Signal. It is contemplated that other additional location identification mechanisms may also be employed, particularly for use within premises. Location awareness and maintenance of data on cloud-based server device 1110 may monitor and report on energy costs at various locations. A cost per energy unit (kWh) may also be maintained to derive customer billing information.

It is contemplated that system 1100 may be configured to operate in a variety of modes to support management of a plurality of apparatuses 200A, 200B that retrieve data from a power distribution unit in accordance with an embodiment of the present disclosure. For example, particular products may be assigned and location may be maintained. The app executable on the mobile device 500 may provide directions for setup of a device, its location, and its presence such as specification, power supply, location, application, customer details. The app executable on the mobile device 500 may keep track of every unit and the timeframe in which the unit needs to be re-scanned/updated. The app may further remind users of power distribution units that need updating and the location of the unit(s) that have not been updated. It is further contemplated that the application may use the operating information to obtain phase load utilization and cooling load per power distribution unit, rack, row, hall, room, and the like. Through storage of the settings and configuration details of a power distribution unit, replacement and re-configuration may be improved during repair, maintenance, refurbishment, or replacement It is contemplated that method and apparatus to retrieve data from a power distribution unit as shown and described with respect to FIGS. 1-11 may provide a number of advantages to users. The advantages may include presentation of much more information than may be made available locally using a simple display. The end user presentation, depicted in FIGS. 7 and 8, may be presented better without a requirement of a large local display which is more expensive and uses significantly more surface space on the power distribution unit. Also, the mobile device 500 may be paired with the apparatus 200 without any complex requirements; no Bluetooth or Ethernet connectivity may be required.

It is contemplated that method and apparatus to retrieve data from a power distribution unit as shown and described with respect to FIGS. 1-11 may also provide a number of advantages to manufacturers of power distribution units. These advantages may include avoiding a need to develop a larger, more feature rich, display located on the unit. As all information associated with a power distribution unit may be transmitted (such as IP address, serial number, and all power and/or cooling information), the onward development potential may be very high. Additionally, apparatus 200 may be configured to provide air gapping which may refer to an industry term of providing a network air-gap. Additionally, an air-gap may provide a new margin of safety and convenience for security reasons. A network air-gap may allow physical isolation between products or networks. True physical isolation may be required to uphold the air-gap and the use of visible light communication in half-duplex and full-duplex configuration allows data to cross from one network to another via a controlled air-gap. The visible light communication supported by apparatus 200 which improves security by effectively isolating equipment from the outside world beyond firewalls, encryption systems, and the like. Further, while one embodiment of a power distribution unit is shown in an exemplary fashion in FIG. 5, it is contemplated that power distribution unit may refer to various types of power devices and thermal devices.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

While the foregoing written description of the disclosure enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above described embodiment, method, and examples, but by all embodiments and methods within the scope and spirit of the disclosure.

In the present disclosure, the methods, operations, and/or functionality disclosed may be implemented as sets of instructions or software readable by a device. Further, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the disclosed subject matter.

It is believed that embodiments of the present disclosure and many of its attendant advantages will be understood by the foregoing description, and it will be apparent that various changes can be made in the form, construction, and arrangement of the components thereof without departing from the scope of the disclosure or without sacrificing all of its material advantages. The form herein before described being merely an explanatory embodiment thereof.

What is claimed is:

1. An apparatus for retrieving data from a power distribution unit, comprising:
    the power distribution unit, the power distribution unit including a housing, the power distribution unit further comprising a tracking circuitry, the tracking circuitry including a sensor to measure operating information; and
    a monitoring device, the monitoring device configured to be contained within the housing of the power distribution unit, the monitoring device including a processor, a memory and a display, wherein the monitoring device is configured to be coupled with the tracking circuitry of the power distribution unit to obtain the operating information for the power distribution unit and convert the operating information into a stream of character sets, wherein each character set includes a plurality of characters in a form of hexadecimal digits, the stream of character sets is presented on the display as individual character sets and not readable to a human eye, the operating information including device identification information, time stamp information, voltage, current, and power available at various circuits of the power distribution unit,
    wherein a camera device of a mobile device is configured to read the stream of character sets on the display,
    wherein the mobile device is configured to verify a cyclic redundancy check data and convert the stream of character sets on the display on the monitoring device into human readable information presented on a display of the mobile device, the human readable information is only presented when the cyclic redundancy check data has been verified.

2. The apparatus as claimed in claim 1, wherein the camera device of the mobile device is configured to read the stream of character sets on the display.

3. The apparatus as claimed in claim 1, wherein the mobile device is configured to execute an application, the application includes an interface, the interface including a plurality of icons and a camera display portion.

4. The apparatus as claimed in claim 3, wherein the camera display portion includes a guide for capturing the character sets of the display of the apparatus.

5. The apparatus as claimed in claim 4, wherein the guide includes at least one or more lines, wherein the at least one or more lines are configured to align with the character sets to improve accuracy of a scan.

6. The apparatus as claimed in claim 3, wherein the plurality of icons includes at least one of a scan icon, a database icon, a capture icon, a scan again icon, a update database icon, a send via email icon, or a cancel icon.

7. The apparatus as claimed in claim 1, wherein the operating information presented on the display of the mobile device is transferred to a remote server device via a cloud-based network.

8. An apparatus for retrieving data from a power distribution unit, comprising:
    a monitoring device, the monitoring device configured to be contained within the power distribution unit, the monitoring device including a processor, a memory and a display, wherein the monitoring device is configured to be coupled with tracking circuitry of the power distribution unit to obtain the operating information for the power distribution unit and convert the operating information into a stream of character sets, wherein each character set includes a plurality of characters in a form of hexadecimal digits, the stream of character sets is presented on the display as individual character sets and not readable to a human eye, the operating information including device identification information, time stamp information, voltage, current, and power available at various circuits of the power distribution unit,
    wherein a camera device of a mobile device is configured to read the stream of character sets on the display,
    wherein the mobile device is configured to verify a cyclic redundancy check data and convert the stream of character sets on the display on the monitoring device into human readable information presented on a display of the mobile device, the human readable information is only presented when the cyclic redundancy check data has been verified.

9. The apparatus as claimed in claim 8, wherein said monitoring device further includes at least one interface button configured to control at least one operation of the monitoring device.

10. The apparatus as claimed in claim 8, wherein the operating information presented on a display of a mobile device is transferred to a remote server device via a cloud-based network.

11. A method, executable by a monitoring device coupled to a tracking circuitry of a power distribution unit, for retrieving data from the power distribution unit, comprising:
receiving data from the tracking circuitry of the power distribution unit, the tracking circuitry including a sensor to measure data, the data including operating information of the power distribution unit, the operating information including device identification information, time stamp information, voltage, current, and power available at various circuits of the power distribution unit;
converting the data from the tracking circuitry into a stream of character sets, wherein each character set includes a plurality of characters in a form of hexadecimal digits; and
presenting the stream of character sets on a display of the monitoring device, wherein the stream of character sets is presented as individual character sets on the display of the monitoring device and not readable to a human eye,
wherein a camera device of a mobile device is configured to read the stream of character sets on the display,
wherein the mobile device is configured to verify a cyclic redundancy check data and convert the stream of character sets on the display on the monitoring device into human readable information presented on a display of the mobile device, the human readable information is only presented when the cyclic redundancy check data has been verified.

12. The method as claimed in claim 11, wherein the operating information presented on a display of a mobile device is transferred to a remote server device via a cloud-based network.

\* \* \* \* \*